Figure 1:
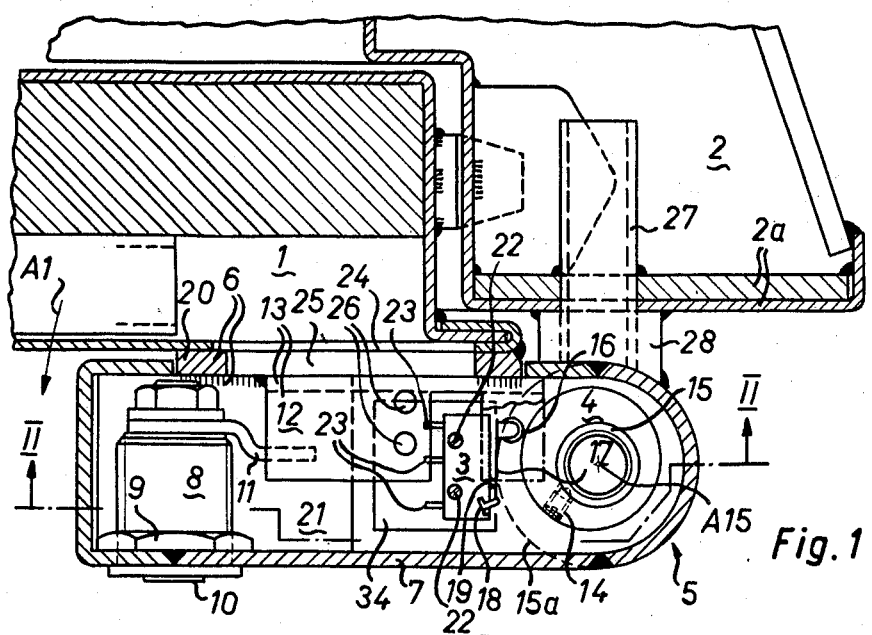

United States Patent [19]

Spahni et al.

[11] 4,394,584
[45] Jul. 19, 1983

[54] SWITCHING DEVICE FOR CHECKING THE CLOSED POSITION OF A FOLDING DOOR

[75] Inventors: Kurt Spahni, Bachs; Walter Bucher, Reichenburg, both of Switzerland

[73] Assignee: Bauer Kassenfabrik AG., Rümlang, Switzerland

[21] Appl. No.: 192,523

[22] PCT Filed: May 3, 1979

[86] PCT No.: PCT/CH79/00065
§ 371 Date: Jan. 3, 1980
§ 102(e) Date: Dec. 14, 1979

[87] PCT Pub. No.: WO79/01028
PCT Pub. Date: Nov. 29, 1979

[30] Foreign Application Priority Data

May 3, 1978 [CH] Switzerland ............... 4861/78

[51] Int. Cl.³ ............... G08B 13/08; H01H 3/16; H03K 17/00; E05G 1/10
[52] U.S. Cl. ............... 307/117; 200/61.62; 200/61.7; 340/549
[58] Field of Search ............... 340/545, 549; 200/61.62, 61.7; 307/117; 339/4

[56] References Cited

U.S. PATENT DOCUMENTS 3,157,756 11/1964 Close et al. ............... 200/61.7
3,840,715 10/1974 Gwozdz ............... 200/61.7
3,973,357 8/1976 Kluempers ............... 200/61.62 X
4,074,246 2/1978 Conklin et al. ............... 340/545 X

FOREIGN PATENT DOCUMENTS 13005 6/1971 Australia .
293222 5/1971 Austria .
1333034 7/1973 United Kingdom .

Primary Examiner—A. D. Pellinen
Assistant Examiner—James L. Dwyer
Attorney, Agent, or Firm—Roylance, Abrams, Berdo & Farley

[57] ABSTRACT

In the case of prison cell doors, strong room doors and the doors of safes and strongboxes the problem exists of protecting a switch fitted to the door or its frame and which as a result of the closing movement of the door releases an alarm signal from manipulations by unauthorized persons, for example the emission of a false signal by a prisoner when the cell door is open. A signal switch (3) with roller (16) is detachably fixed to door (1) and a stationary eccentric disc (4) which serves as the switch actuator is detachably fixed to frame (2). This mechanical switch device (3, 4, 16) is housed in a casing (5), whose base (6) is welded to door (1) and whose coverlike cap (7) is locked from the inside to casing base (6) by means of a cylindrical lock (8) in casing (5) and is consequently secured against raising therefrom. In the case of an optical switching device a transmitter (35) for infrared alternating light (41) and a receiver (36) with switching transistor (49) are arranged within the door (1) or frame (2) or vice versa. Only when the door (1) is closed is an infrared beam (41) passed through two aligned transmission beam ports (39, 40) in door (1) and frame (2) to receiver (36), thereby releasing an alarm signal.

7 Claims, 8 Drawing Figures

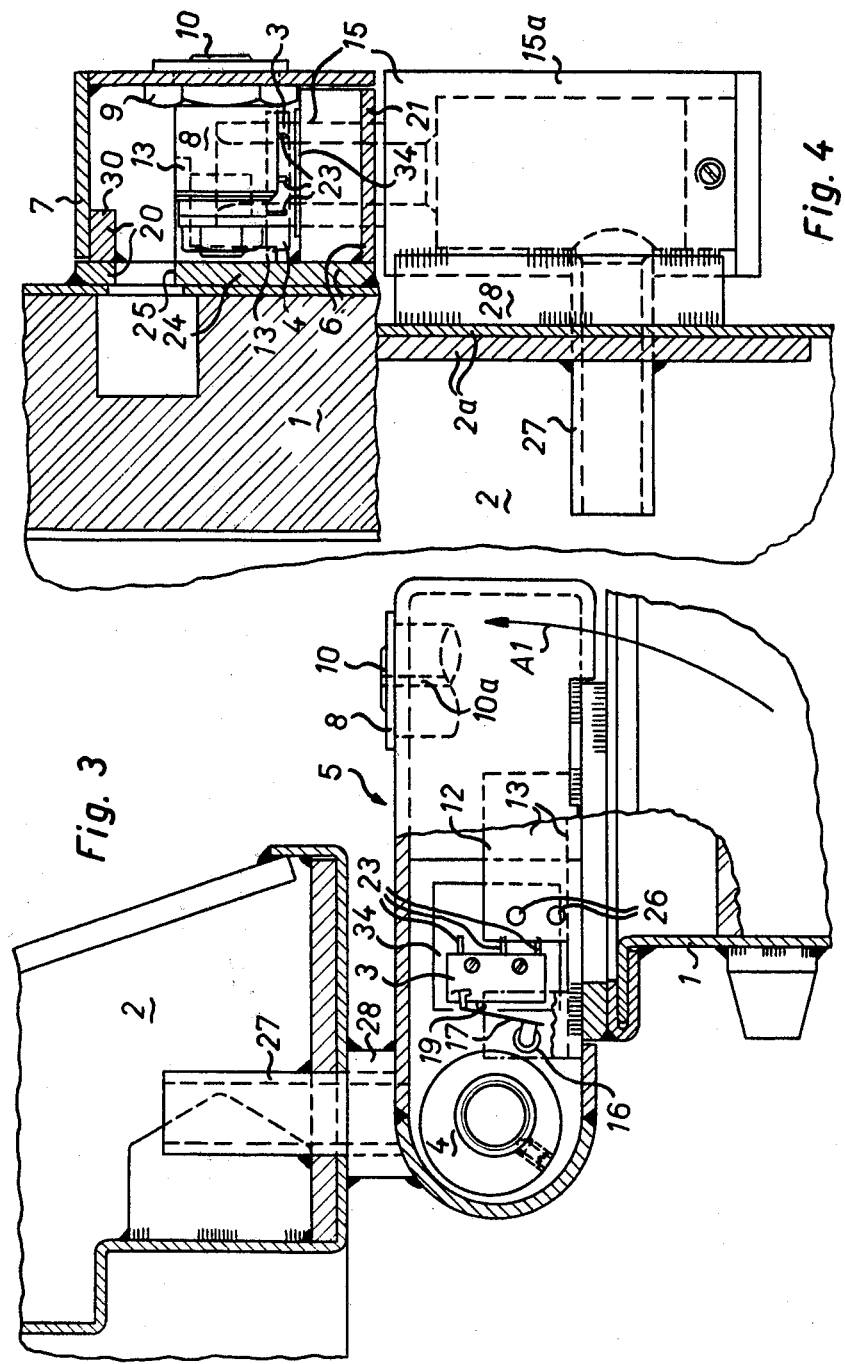

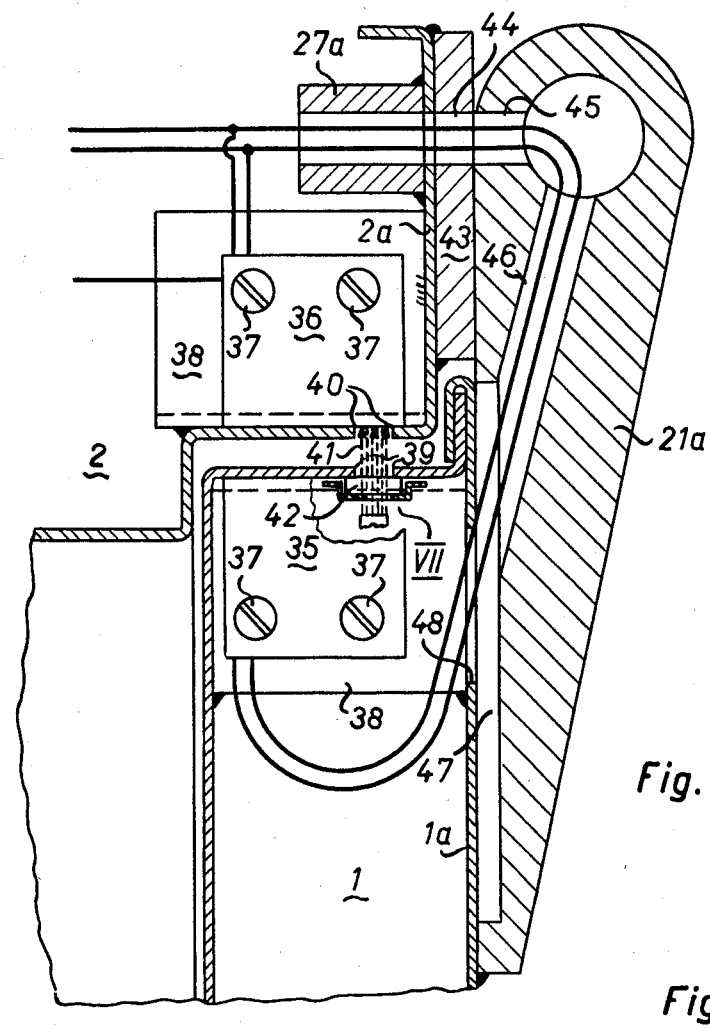
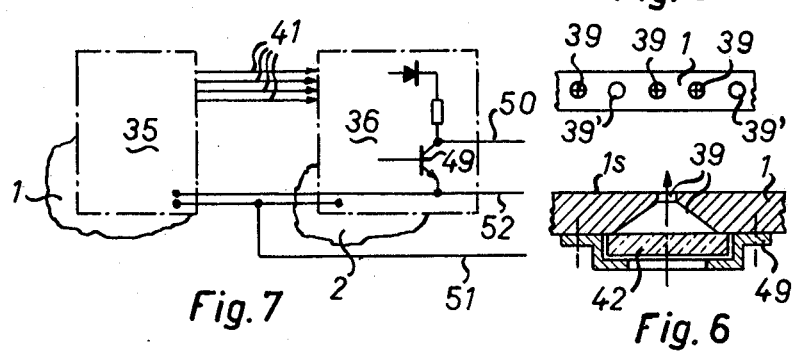

SWITCHING DEVICE FOR CHECKING THE CLOSED POSITION OF A FOLDING DOOR

The invention relates to a switching device for checking the closed position of a folding door in which a signal is released due to the closing movement of the door by means of a switch fitted to the door or its frame.

According to the invention this device can be used with equal advantage on all folding doors in which importance is attached to the reliable checking of their closed state, e.g. prison cell doors, strong room doors, doors of strongboxes and safes.

In a known mechanical switching device of the type defined hereinbefore which is used for monitoring the closing of prison cell doors an electrical signal circuit is closed by the closing movement of the cell door and as a result an acoustic and/or optical alarm signal is given for the guard. In the case of this known device a signal switch with a spring-mounted tripping pin and constructed as a mechanical pushbutton switch is arranged inside the cell door and on closing the cell door mounted so as to swing by means of hinges on the door frame is automatically forced inwards by a stationary switch actuating member provided on the frame and as a result closes the signal circuit.

However, this known switching device is not sabotage-proof because it is possible for an unauthorised person such as a prisoner to operate the switch with the cell door open, i.e. without closing the latter, by pressing the tripping pin inwards by hand or by locking the same, e.g. by means of a match, thereby releasing the door closing signal in order to mislead the guard responsible for the particular prison wing in order to prepare e.g. for a prison riot.

Live magnetic switch devices are also known for checking the closing of a prison cell door in which a magnetic field is closed by the closing movement of the cell door and consequently an alarm signal is released. However, such devices are not deception-proof against stray fields, i.e. they are also not sabotage-proof, because the magnetic field can also be closed when the door is opened by an unauthorised person holding out a piece of iron, e.g. an iron plate which serves as a stray field and as a result a misleading alarm signal can be given.

The object of the invention is to eliminate this disadvantage and its problem is therefore to provide a switching device of the type indicated hereinbefore which is protected in an optimum manner against any manipulations by unauthorised persons, i.e. it is sabotage-proof.

According to the invention this problem is solved by a switching device of the type defined hereinbefore wherein the switching device is made inaccessible to unauthorised persons by covering members connected in undetachable, non-destructive manner to the door and frame.

A preferred embodiment of the invention can be constituted by a mechanical switching device wherein the signal switch arranged on the door and the switching member for the actuation thereof arranged on the frame are located in a common casing comprising a casing base undetachably and non-destructively connected to the door and a casing cap placed thereon and which is locked to the casing base by a safety lock arranged within the casing and detachably and non-destructively joined to the casing cap from the inside and is therefore secured against raising by an unauthorised person, and wherein the casing base has a locking stop covered by the casing cap for the lock bolt which it also covers, whilst the switch and its actuator only become accessible after raising the unlocked casing cap from the casing base.

According to a preferred embodiment of the switching device the switching member comprises an eccentric disc provided on a pin connected in undetachable and non-destructive manner with the frame, whilst a movable switch part of the switch is provided with a roller which runs on the eccentric disc circumference on swinging the door.

According to another embodiment of the mechanical switching device the pin forming a pivot bearing for the casing base passes through a portion of said base which projects over the hinge side of the door and the eccentric disc is detachably and non-destructively fixed to a pin portion projecting into the casing, the switch is detachably and non-destructively connected to a lower portion of the casing base and the hollow pin serves at the same time to receive the switch cable which passes out of the inside of the frame and leads it to the switch.

Preferably the construction to be used of this switching device comprises the cross-sectionally substantially U-shaped casing base comprises a carrier plate bent at right angles and a horizontally extending band plate which is non-detachably and non-destructively connected thereto, whilst one horizontal limb of the carrier plate forms a support stop for the casing cap which can be raised vertically upwards from the casing base and a stop bracket whose horizontal limb serves as a locking stop is undetachably and non-destructively connected to the downwardly projecting limb of the carrier plate.

According to another preferred embodiment of the switching device a lower part of the pin is undetachably and non-destructively connected to the frame by a pin shoe which spaces it from the frame and a cable duct undetachably and non-destructively connected therewith passes through the frame front wall, the pin shoe and a frame-side wall portion of the lower pin part.

Finally a preferred embodiment of the mechanical switching device comprises the vertically upwardly projecting limb of the bent carrier plate is provided with a horizontally extending window-like recess and the stop bracket is provided on its horizontal stop limb with openings for the passage of the cable to the switch.

According to the invention a preferred embodiment of an optical switching device comprises an infrared alternating light transmitter and a receiver provided with a switching transistor associated with said transmitter and which are arranged within the door and/or frame or vice versa and are undetachably and non-destructively connected therewith, as well as openings in the door and frame for the infrared beam which are aligned when the door is in the closed position and bulletproof glass sheets for covering the beam transmission openings arranged within the door and the frame and undetachably and non-destructively connected therewith from the outside.

According to a preferred embodiment of the switching device within the frame is provided a cable lead-in tube which is undetachably and non-destructively connected therewith and a band plate arranged level with the transmitter and the receiver and connected undetachably and non-destructively with the door has a plurality of openings corresponding to the cable lead-in tube, whilst the front wall of the door has a window-like opening for the passage of the cable and which is completely covered by the band plate.

According to a preferred embodiment of the optical switching device the transmitter and the receiver are set up for a plurality of beam transmissions and the door and frame are provided with a number of beam transmission ports covered by bulletproof glass sheets corresponding to the number of beams.

Figure 2:
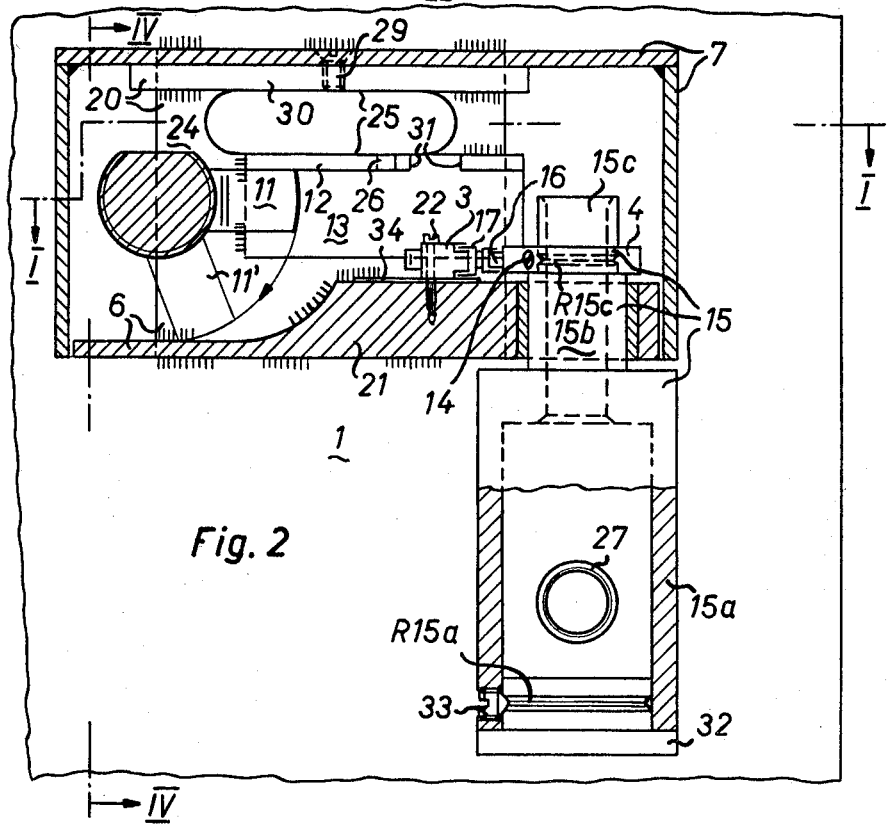

Two embodiments of the switching device according to the invention are described in greater detail hereinafter with reference to the attached drawings, wherein show:

FIG. 1 a mechanical switching device with the door closed in a horizontal section along the line I—I of FIG. 2.

FIG. 2 the switching device according to FIG. 1 in a vertical section along the line II—II of FIG. 1.

FIG. 3 the switching device according to FIG. 1 with the door open in the same horizontal section as in FIG. 1.

FIG. 4 the switching device according to FIGS. 1 and 2 with the door closed in a vertical section along the line IV—IV of FIG. 2.

FIG. 5 an optical switching device with the door closed in a horizontal section through the door and the frame.

FIG. 6 the cover of the beam transmission port in the door as Detail VII of the switching device of FIG. 5 on a larger scale.

FIG. 7 a circuit diagram of the switching device of FIG. 5.

FIG. 8 the arrangement of beam transmission ports on the edge of the door for a switching device according to FIG. 5, but with an infrared radiation transmitter for a plurality of beams in a diagrammatic plan view of the door edge.

In FIG. 1 the swinging door is 1 and the associated door frame 2. Door 1 is mounted so as to swing outwards on frame 2 in the direction of the rotation direction arrow A1 by means of a plurality of hinges not shown by reasons of clarity in FIG. 1. In FIG. 1 the door is in its closed position and is e.g. a prison cell door, frame 2 being embedded in the corridor-side cell wall and firmly anchored thereto. A signal switch 3 located on door 1 and a switching member 4 provided for the actuation thereof on frame 2 are located in a common casing 5 which essentially comprises a casing base 6 located on door 1 and a cover-like casing cap 7 which can be placed thereon (cf also FIGS. 2 and 4). Casing base 6 is welded at several points to the front of door 1, i.e. it cannot be removed without damaging or destroying parts of door 1. Such a connection of parts, designated hereinafter as "undetachably and nondestructively" is of decisive importance for the protection of the switching device against manipulations by an unauthorised person, namely a prisoner. Casing 5 also contains a safety lock 8, constructed in this case as a cylindrical lock and which serves to internally lock casing cap 7 to casing base 6, which prevents unauthorized raising of cap 7 from base 6. Since, due to the locked casing cap 7, the cylindrical lock 8 is not accessible to unauthorised persons it can be detachably connected to casing cap 7 by means of a hexagonal nut 9. The rotor 10 of cylindrical lock 8 is provided at the front with a key channel for the insertion of a fitting flat key and has at its rear end a bolt 11 which in its locking rotation position engages from below on a horizontally directed limb 12 of a stop bracket 13 welded to the casing base 6 and thereby prevents any raising in a vertically upwards direction of casing cap 7 from casing base 6.

Switching member 4 for actuating the signal switch 3 is in this case constructed as an eccentric disc and by means of a set screw 14 is detachably but non-rotatably fixed with respect to a vertically extending pin 15 and is in turn welded to door frame 2. Axis A15 of pin 15 coincides with the swivel axis of swinging door 1 and is therefore also aligned with the door hinge axes. A roller 16 belonging to switch 3 on swinging door 1 runs on the circumference of eccentric disc 4 and is pivoted on the free end of a switch lever 17, which is in turn pivoted at 18 in switch 3. Switch lever 17 is in continuous working connection with a contact stud 19 which is responsible for the actual switching process, i.e. it closes the circuit for releasing an alarm signal. In FIG. 1, which shows the door in its closed position the signal circuit is closed, i.e. when door 1 is closed switch lever 17 is pressed by the stationary eccentric disc 4 via roller 16 against contact stud 19 counter to the pressure of a spring which cannot be seen in FIG. 1, thereby closing the circuit. A special mechanism ensures that after supplying an alarm signal of given duration the signal circuit is opened again, so that after some time the signal tone dies away again.

The substantially U-shaped casing base 6 shown in vertical section in FIG. 4 comprises a carrier plate 20 bent at right angles and a horizontally extended band plate 21 welded thereto (cf FIGS. 2 and 4). Switch 3 which is screwed to plate 20 by means of two fastening screws 22 (cf also FIG. 2) has three cable connections 23 to which are connected the cables of the signal circuit system. The vertically downwardly projecting limb 24 of the angular carrier plate 20 has a window-like recess 25 for the passage of the cable from the inside of door 1, whilst the horizontally directed limb 12 of the stop bracket 13 welded to the carrier plate 20 is provided with two openings 26 for the passage of two of these three cables to the two cable connections 23 covered by the angle bracket limb 12.

The twice recessed pin 15 is hollow cylindrical (cf FIG. 2) and serves at the same time to carry the cable from the inside of frame 2 to switch 3. For this purpose a cable lead-in duct 27 is also provided which is welded from behind to the front wall 2a of frame 2 and passes through the latter, as well as a pin shoe 28 which spaces the pin 15 from frame 2 and a frame-sidewall portion of the lower hollow cylindrical part 15a of pin 15 (cf also FIG. 4). Pin shoe 28 is welded to the front wall 2a of frame 2 and in turn the lower portion 15a of pin 15 is welded to the pin shoe 28 (cf also FIG. 4).

FIG. 2 shows how the casing cap 7 is unlocked from casing base 6 when an authorised person using a key which fits cylindrical lock 8 turns the lock rotor and at the same time also the lock bolt 11 from the locking rotation position into the unlocking rotation position indicated at 11'. During this unlocking process the downwardly pivoting lock bolt 11 is freed from the horizontal limb 12 of stop bracket 13, after which the cover-like casing cap 7 can be raised vertically upwards from the carrier plate 20 belonging to base 6 if previously a fastening screw 29 which only serves to fix cap 7 is unscrewed from the horizontal limb 30 of the angular carrier plate 20 and which serves as a support for cap 7. Stop bracket 13 welded to carrier plate 20 is provided with a recess 31 on its horizontal limb 12 and this recess gives access to the two switch fastening screws 22. This can be gathered from FIG. 1 where the right-hand tab of the horizontal limb 12 is shown broken away in order to show the switch lever 17 and cam follower 16 located thereunder. FIG. 2 also clearly shows how the angular carrier plate 20 and plate 21 welded to the bottom thereof form the casing base 6 which by welding plate 20 to door 1 is undetachably and non-destructively connected thereto, the shape and dimensions of cap 7 being adapted to base 6 which receives it (cf also FIG. 4). FIG. 2 also shows the twice recessed cylindrical pin 15 into whose lower hollow cylindrical part 15a issues the cable lead-in tube 27, whose central pin portion 15b passes through plate 21 and to whose upper pin portion 15c, having the smallest diameter, is detachably fixed eccentric disc 4 by means of clamping bolt 14 which engages in an annular groove R15c of pin portion 15c. Pin 15 which is hollow cylindrical from bottom to top in order to be able to supply to switch 3 through pin 15 the cable carried in cable lead-in tube 27, is closed at the bottom by a pin cover 32 fixed to pin 15 by means of a clamping bolt 33 engaging in an annular groove R15a of the lower pin portion 15a. A rectangular mounting plate 34 (cf also FIG. 1) ensures by the selection of its thickness the correct height position of switch 3 or its cam follower 16.

FIG. 3 shows door 1 together with casing 5 fixed undetachably and non-destructively thereto and which contains the switching device swung in the direction of rotation arrow A1 by 180° into its open position. During the swinging of folding door 1 the roller 16 of switch lever 17 which rolls on the fixed eccentric disc 4 has freed itself from disc 4, so that the outwardly pivoting switch lever 17 makes it possible for the contact stud 19, under the pressure of its spring to pass leftwards out of the switch casing 3 in FIG. 3, thereby interrupting the signal circuit. FIG. 3 also shows the approximately square mounting plate 34 for switch 3, the three cable connections 23 and the two openings 26 of stop bracket limb 12 on bracket 13. The front ends of cylindrical lock 8 and its rotor or cylinder core 10 provided with key channel 10a are located at the rear with door 1 open.

FIG. 4 shows a vertical section of the switching device with door 1 closed. The horizontally directed member 30 of angular carrier plate 20, which serves as a support stop for casing cap 7, comprises a strip which, above the cable passage window 25 is welded to the vertical plate limb 24 of carrier plate 20 (cf also FIG. 2). FIG. 4 again shows the cylindrical lock 8 with fastening nut 9 and rotor 10, the stop bracket 13 which is partly covered by cylindrical lock 8, eccentric disc 4 partly covered by switch 3, plate 21 welded at the bottom to the vertical limb 24 of carrier plate 20 and the three cable connections 23. FIG. 4 also clearly shows how pin 15 is spaced from frame 2 by pin shoe 28 welded on the one hand to the front wall 2a of frame 2 and on the other to pin portion 15a and how it is undetachably and non-destructively connected therewith. FIG. 4 also shows how the cables can be passed from the inside of frame 2 through the cable lead-in tube 17 welded to the back of the frame front wall 2a and subsequently through the cavity of the hollow cylindrical pin 15 up to switch 3 or its cable connections 23.

FIG. 5 diagrammatically shows in a cross-section through door 1 and frame 2 a signal switching device actuated by means of infrared alternating light beams. Within door 1 is provided a transmitter 35 and within frame 2 a receiver 36 and these are screwed by two fastening screws 37 to a mounting plate 38 connected to door 1 or frame 2. Door 1 and frame 2 are provided in each case with a beam transmission port 39 or 40 for the passage of infrared beams from transmitter 35 to receiver 36. When door 1 is closed (cf FIG. 5) the two ports 39 and 40 are aligned and only then can the receiver 36 receive the infrared beam 41 from transmitter 35 and further process the same as will be explained in greater detail hereinafter relative to FIG. 7. The switching device is protected against sabotage by bullet-proof glass sheets 42 of which FIG. 5 only shows the sheet belonging to port 39, i.e. associated with transmitter 35. The way in which the bulletproof glass panes 42 are arranged and fixed to the lateral wall of door 1 or frame 2 will be described hereinafter relative to FIG. 6. A band plate 21a is welded to door 1 and at the same height a cable lead-in tube 27a is welded to frame 2, both of whose height corresponds to transmitter 35 or receiver 36. A plate 43 welded to the front wall 2a of frame 2 has an opening 44 aligned with the opening of the cable lead-in tube 27a. Openings 45 and 46 at the same height are provided in plate 21a and correspond to the opening 44 of plate 43 and therefore also with the internal diameter of cable lead-in tube 27a. Two cables of the cable system indicated symbolically by thick lines in FIG. 5 are passed through the cable lead-in tube 27a and the following openings 44, 45 and 46 to the transmitter 35, whilst also traversing a recess 47 in plate 21a and a window opening 48 in front wall 1a of door 1, the latter being covered completely by the plate 21a welded to door 1.

In FIG. 6 the beam transmission port 39 of door 1 is completely covered from the inside by the bulletproof glass sheet 42. A retaining ring 49 which serves to fix the bulletproof sheet 42 is fixed from the inside to door 1, e.g. by means of screws. Port 39 has on the outer door wall surface 1s only a relatively small internal diameter which is adequate for the passage of the infrared beams and which widens conically in the rearward direction. This construction of the transmission port 39 facilitates the assembly of transmitter 35 (cf FIG. 5) with a view to a completely satisfactory beam transmission, because as a result thereof the accuracy of adjustment can be correspondingly reduced. In the same way port 40 in frame 2 (cf FIG. 5) associated with receiver 36 is covered from the inside by a bulletproof glass sheet 42.

FIG. 7 shows a circuit diagram for the switching device of FIG. 5. The beam 41 passes from transmitter 35 in door 1 to receiver 36 in frame 2. Beam 41, which is in the form of infrared alternating light beams with a pulse repetition frequency of approximately 2 kHz switches a switching transistor 49 provided in receiver 36 when door 1 is in the closed position and this signal is processed by the alarm system. The signal from transistor 49 is designated by 50 in FIG. 7. The mains voltage system is indicated by a positive wire 51 and a negative wire 52 and can for example be designed for a voltage of 24 V. If door 1 is open the infrared alternating light passage is interrupted, because the two beam transmission ports 39 and 40 (cf FIG. 5) are no longer aligned, so that beam 41 can no longer reach receiver 36. Thus, with door 1 open transistor 49 is blocked and can therefore no longer supply a signal via line 50 to the alarm system.

According to FIG. 8 the transmitter and the receiver can be set up in such a way that a plurality of sharply focussed beams can be transmitted by the transmitter or received by the receiver. Therefore the lateral door wall and the frame wall associated therewith contain a plurality of beam transmission ports which are aligned in pairs with the door closed.

It is advantageous to provide these ports on the horizontally directed upper edge of the door or frame because they are then difficulty accessible to unauthorised persons. FIG. 8 shows a series of ports 39 arranged on the upper horizontal edge of door 1. As the individual beams are closely focussed the transmission ports 39 can have a very small internal diameter. Of the five ports shown in FIG. 8 in this case beams from the transmitter only strike three ports 39, whilst the other two ports 39' are only blind ports, i.e. never receive beams. Due to the irregular arrangement of active ports 39 and blind ports 39' in the opening row and/or by irregular distribution of their positions on the door edge surface the possibility of sabotage by manipulation on the part of unauthorised persons is further reduced. The ports 40 arranged in the upper horizontal frame edge are obviously arranged as regards position and active or blind characteristics in exactly the same way as the active ports 39 and blind ports 39'.

We claim:

1. A switching device for checking the closed position of a swinging door mounted in a frame, the device being of the type in which a signal is produced by the closing movement of the door relative to the frame comprising
   a signal switch mounted on the door;
   a switch actuating member attached to the frame; and
   a housing on said door substantially totally enclosing said switch and said member, said housing including
      a housing base fixedly and undetachably attached to the door,
      a housing cap releasably attachable to said base to form a closed volume,
      said base having a locking stop member formed thereon in said closed volume, and
      a lock mounted on said cap, said lock having a lock bolt engageable with said locking stop to retain said cap in its attached position on said base when said lock is in the locked position;
   said switch and switch actuating member being accessible only when said lock is operated to its unlocked position and said cap is released from said base.

2. A switching device according to claim 1 wherein said switching actuating member comprises
   a pin undetachably connected to said frame in coaxial alignment with the hinge axis of the door, and
   a disk eccentrically mounted on said pin;
   and wherein said switch includes
   a switchable contact set fixedly attached to said base,
   an arm movably mounted relative to said contact set,
   means interconnecting said arm and contact set to operate the contact set when the arm is moved, and
   a roller mounted on said arm and rolling on said disk whereby movement of said door and base relative to said frame causes actuation of said contact set.

3. A switching device according to claim 2 wherein said base projects across the pivot axis for the door and said pin passes through and forms a pivot bearing for said base, said pin being hollow and also forming a cable conduit for electrical conductors extending between said switching and said frame.

4. A switching device according to claim 1 wherein said base is generally U-shaped in cross-section and includes a carrier plate extending perpendicular to one wall thereof and a horizontally extending band plate non-detachably connected to said wall, a horizontal limb of said carrier plate forming a support stop for said cap so that said cap can be lifted vertically therefrom, said base also including a bracket having a horizontal member defining said locking stop.

5. A switching device according to claim 3 and including a pin shoe nondetachably connected to said frame and supporting said pin, and means defining a cable duct fixedly attached to and extending through said frame and pin shoe and engaging said pin.

6. A switching device according to claim 4 wherein said carrier plate and said support stop include means defining access openings for passage of conductors to said switch.

7. A switching device for checking the closed position of a swinging door mounted in a frame, the device being of the type in which a signal is produced by the closing movement of the door relative to the frame comprising
   an infrared transmitting device in one of the door and frame;
   an infrared receiving device in the other of the door and frame for producing a distinguishable signal when infrared energy is received;
   circuit means including a switching transistor coupled to said transmitting device for selectively activating said receiving device to produce an alarm-activating signal in the presence of infrared energy;
   means defining a plurality of ports in each of said door and frame to permit passage to infrared energy therethrough, said ports being aligned in pairs when the door is closed,
      said transmitting device being arranged to project energy and said receiving device being arranged to receive energy through at least one but less than all of said pairs of ports;
   a pane of bullet proof glass transparent to infrared energy covering each of said ports, each said pane being undetachably fastened to its associated port;
   conductor means for interconnecting said transmitting and receiving devices; and
   means undetachably fastened to said door for providing a conduit for said conductor means when said door is closed and open and to inhibit tampering with said conductor means.

* * * * *